(12) United States Patent
Weber et al.

(10) Patent No.: US 8,753,456 B2
(45) Date of Patent: Jun. 17, 2014

(54) SELECTIVE NITRIDING ON A 3D SURFACE

(75) Inventors: Douglas J. Weber, Arcadia, CA (US);
Naoto Matsuyuki, Kasugai (JP)

(73) Assignee: Apple Inc., Cupertino, CA (US)

( * ) Notice: Subject to any disclaimer, the term of this patent is extended or adjusted under 35 U.S.C. 154(b) by 490 days.

(21) Appl. No.: 12/916,741

(22) Filed: Nov. 1, 2010

(65) Prior Publication Data

US 2011/0317340 A1 Dec. 29, 2011

Related U.S. Application Data

(60) Provisional application No. 61/358,763, filed on Jun. 25, 2010.

(51) Int. Cl.
*C23C 8/26* (2006.01)
(52) U.S. Cl.
USPC ........................................... 148/212

(58) Field of Classification Search
USPC .......................................... 427/577; 148/212
See application file for complete search history.

(56) References Cited

U.S. PATENT DOCUMENTS

| | | | |
|---|---|---|---|
| 7,389,154 | B2 | 6/2008 | Hunter et al. |
| 7,402,517 | B2 | 7/2008 | Yonker et al. |
| 7,696,102 | B2 | 4/2010 | Zhang |
| 2007/0175857 | A1 | 8/2007 | Boone |

*Primary Examiner* — Jessee Roe
(74) *Attorney, Agent, or Firm* — Womble Caryle Sandridge & Rice LLP

(57) ABSTRACT

Forming a 3D topology by forming a monolayer of nano-particles on a stainless steel surface, masking the stainless steel surface forming at least one unmasked regions, the unmasked region having an average density of nano-particles less than a critical average density, and introducing a plurality of exogenous atoms into the stainless steel surface only in the unmasked regions, the exogenous atoms causing the associated metal lattice to expand and harden and have an increase corrosion resistance, thereby selectively forming a 3D topology on the stainless steel surface.

21 Claims, 13 Drawing Sheets

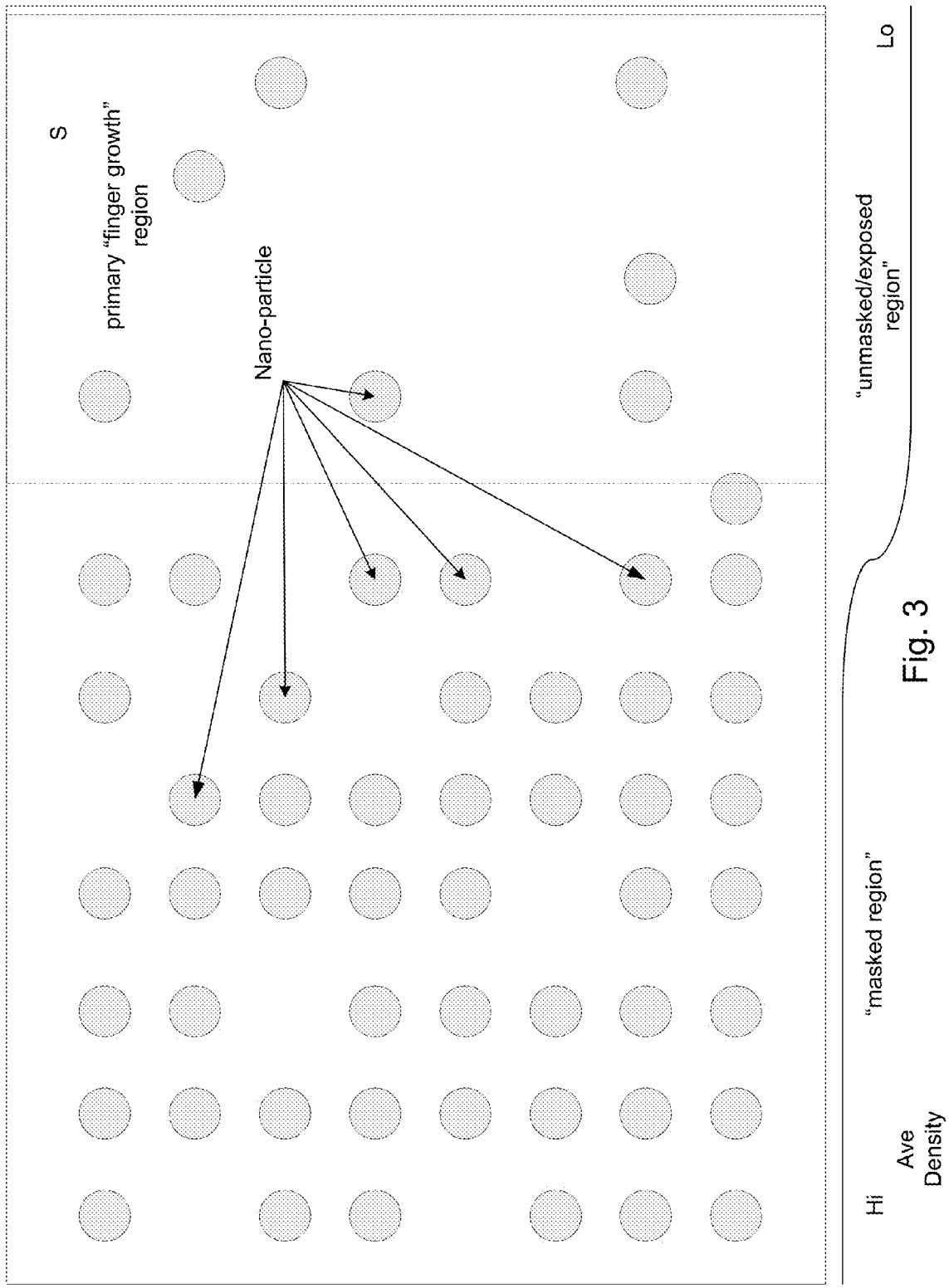

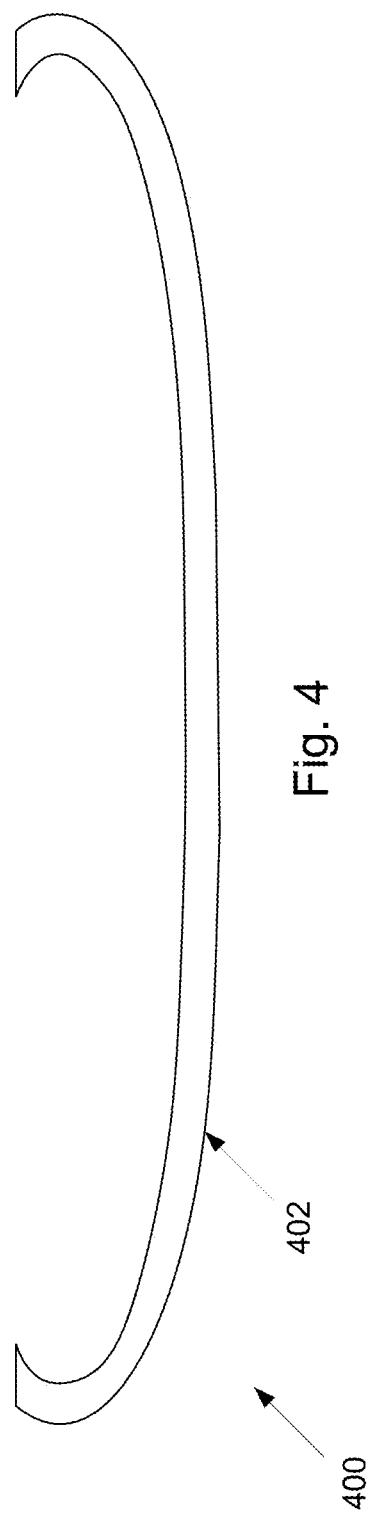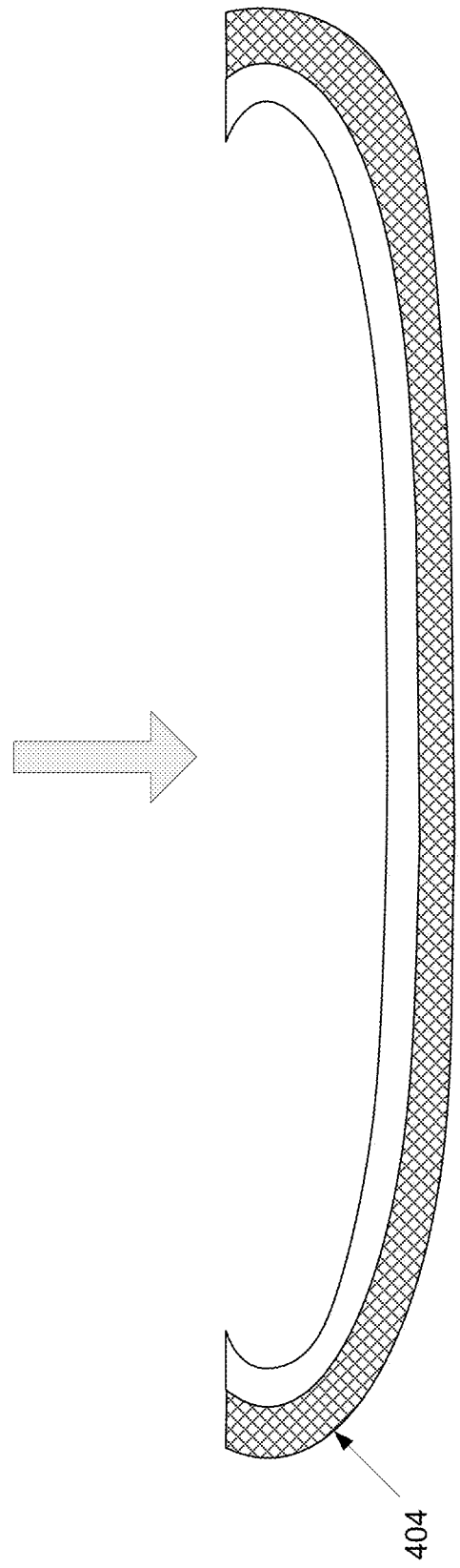

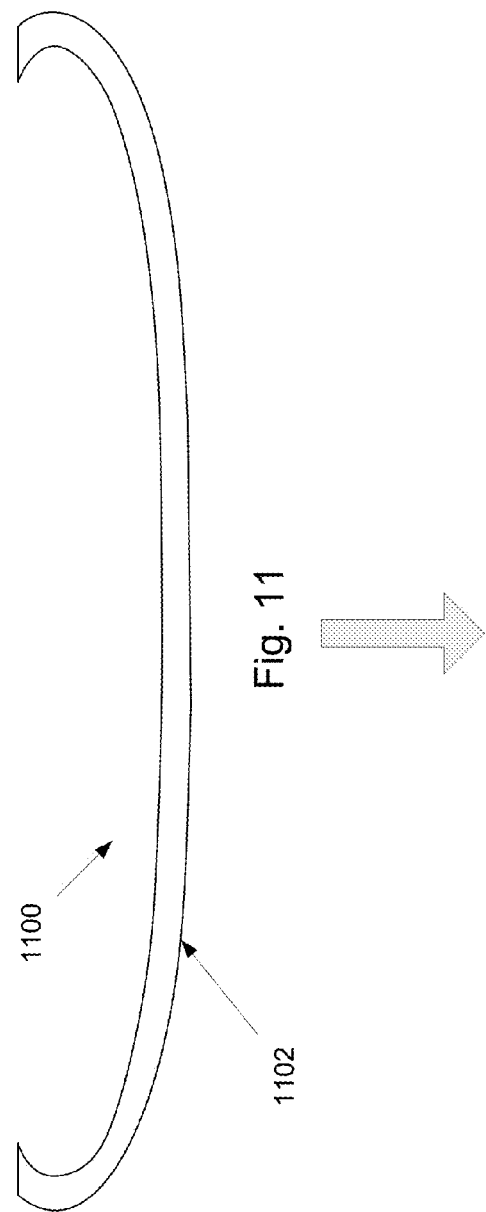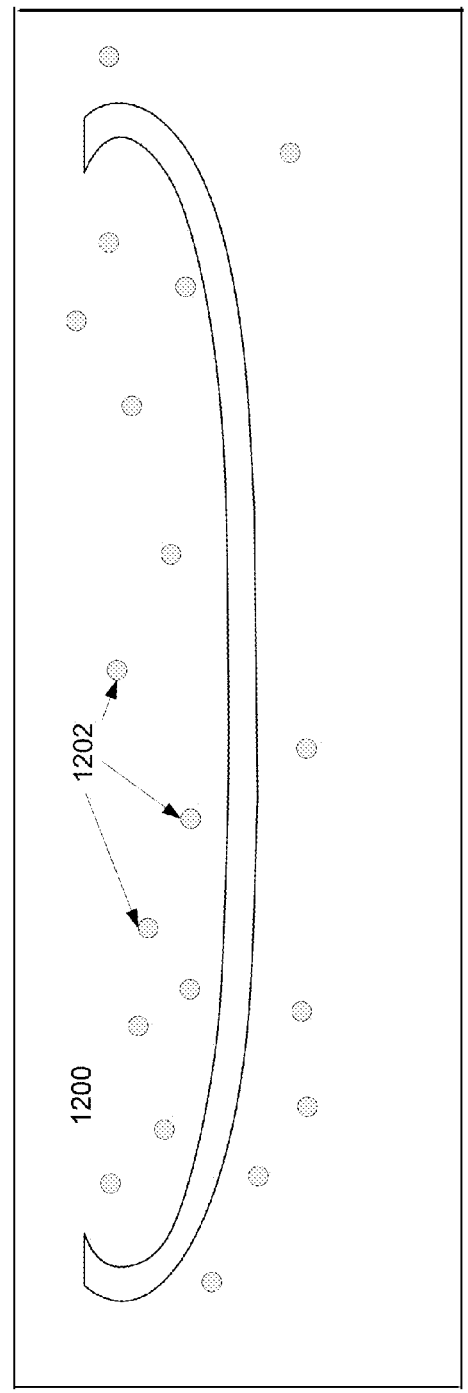

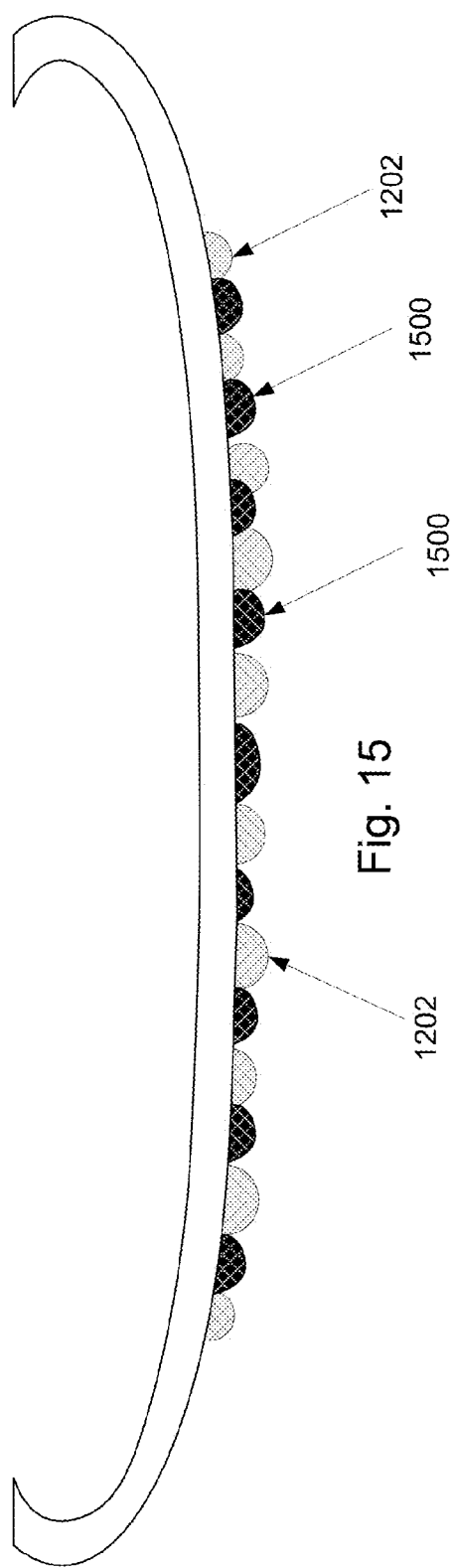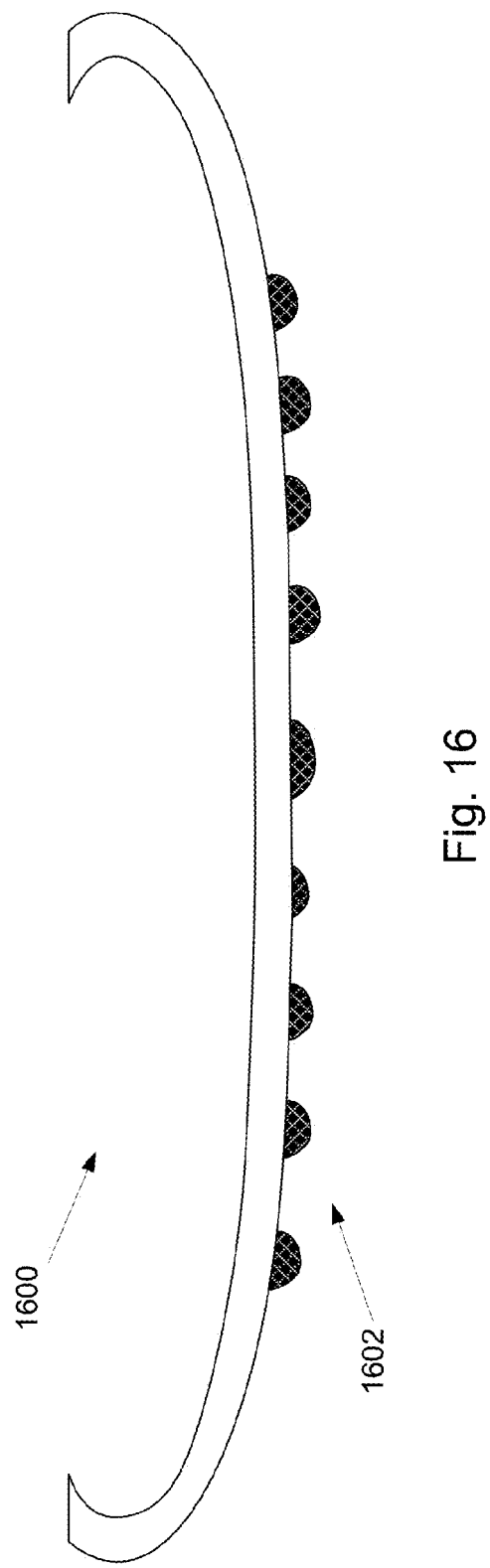

SELECTIVE NITRIDING ON A 3D SURFACE

CROSS REFERENCE TO RELATED APPLICATIONS

This application claims priority under 35 U.S.C. 119(e) to U.S. Provisional Patent Application No. 61/358,763 filed Jun. 25, 2010 and entitled "SELECTIVE NITRIDING ON A 3D SURFACE" by Douglas J. Weber and is incorporated by reference in its entirety.

BACKGROUND OF THE INVENTION

1. Field of the Invention

The described embodiments relate generally to consumer electronic products and more particularly to forming a 3D topology on a surface of the consumer electronic product that is hard and corrosion resistant.

2. Description of the Related Art

It is desired to provide consumer products having surface features that are hard and resistant to corrosion. The surface features can therefore resist everyday wear and tear caused by user handling.

SUMMARY OF THE DESCRIBED EMBODIMENTS

This paper describes various embodiments for forming 3D topologies on a surface. The surface can be used in a consumer electronic product and be formed of at least in part stainless steel.

A method for forming a 3D topology can be carried out by forming a monolayer of nano-particles on a stainless steel surface, masking the stainless steel surface forming at least one unmasked regions, the unmasked region having an average density of nano-particles less than a critical average density, and introducing a plurality of exogenous atoms into the stainless steel surface only in the unmasked regions, the exogenous atoms causing the associated metal lattice to expand and harden and have an increase corrosion resistance, thereby selectively forming a 3D topology on the stainless steel surface.

In another embodiment, a layer of masking material can be overlaid a product having a surface upon which a three dimensional topology is desired. The portions of the layer of masking material are then removed to form a masking pattern to expose corresponding portions of the surface. The product along with the patterned masking material on the surface are then exposed to a nitriding atmosphere causing a plurality of nitride fingers to formed only at the exposed portions of the surface. The layer of masking material is then removed leaving only the nitride fingers on the surface of the product in the form of the three dimensional topology.

In yet another embodiment, a product having a surface upon which a three dimensional topology is desired is placed in an environment of self organizing masking particles. The self organizing masking particles adhere to the surface in a manner consistent the self organization of the masking particles leaving at least some of the surface exposed. In one embodiment, the self organizing particles can take the form of nano-particles that mutually repel each other to form a self organization arrangement on the surface. The product along with the self organized masking particles on the surface is then placed in a nitriding atmosphere causing a plurality of nitride fingers to form at the exposed portions of the surface. The masking particles are then removed to leave the nitride fingers on the surface of the product in the form of the three dimensional topology.

A consumer electronic product includes at least a plurality of operational components, a housing arranged to enclose and secure at least some of the plurality of operational components, and a plurality of nitride fingers arranged on a surface of the housing in a pattern, the pattern comprising a 3D topology.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which:

FIG. 3 shows a representative cross section of surface S illustrating relative nano-particle average density for masked region and unmasked/exposed region.

FIGS. 4-9 show representative cross sections detailing the formation of a three dimensional topology on a surface in accordance with one embodiment.

FIGS. 11-16 show representative cross sections detailing the formation of a three dimensional topology on a surface in accordance with one embodiment.

DETAILED DESCRIPTION OF SELECTED EMBODIMENTS

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein describe techniques suitable for selective nitriding on a three dimensional surface formed of for the most part stainless steel. In one implementation, portions of the surface can be masked while other portions can remain exposed to a nitriding environment such as found in plasma nitriding and gas nitriding. During the nitriding process (either plasma or gas) the portion of the metal surface exposed to the nitriding environment expands. The expansion can be caused by the incorporation of exogenous atoms (such as nitrogen and/or carbon) introduced into the metallic substrate by the nitrogen environment. The incorporation of the exogenous atoms has the added effect of increasing both the hardness of the expanded portions (to at least around 1000 HV) as well as corrosion resistance.

It should be noted that since the expansion occurs only in those regions of the surface exposed to the nitriding environment, a 3D topology can be formed on the surface defined by the expanded regions. Moreover, due to the increased hardness and corrosion resistance of the expanded regions, the 3D topography can be well suited for consumer products since every day handling would leave the topological features formed by the expanded regions substantially unaffected.

It should be noted that as part of the expansion, what are referred to as fingers "grow" from the portion of the surface exposed to the nitiriding environment. In this way, masking off regions of the surface to allow the growth of the fingers. In one embodiment, an electron beam can be used to create a 2D mask by etching off portions of a polymer or other appropriate masking material to form exposed regions and covered or non-exposed regions. In so doing, only the regions that are exposed regions and are exposed to the exogenous atoms from the nitiriding environment will undergo the selective expansion.

In another embodiment, a mask can be formed by subjecting the surface on Which the 3D topology is to be formed to a plurality of self-organizing particles. The self organization of the particles can be driven by many factors. For example, in one class of self-organizing particles, the self organization can be driven by the mutual self repulsion between each of the plurality of particles. Such particles can take the form of nano-particles each of which can electrostatically repel each other to form a matrix like structure that can be used to mask selected portions of the surface.

Figure 1:
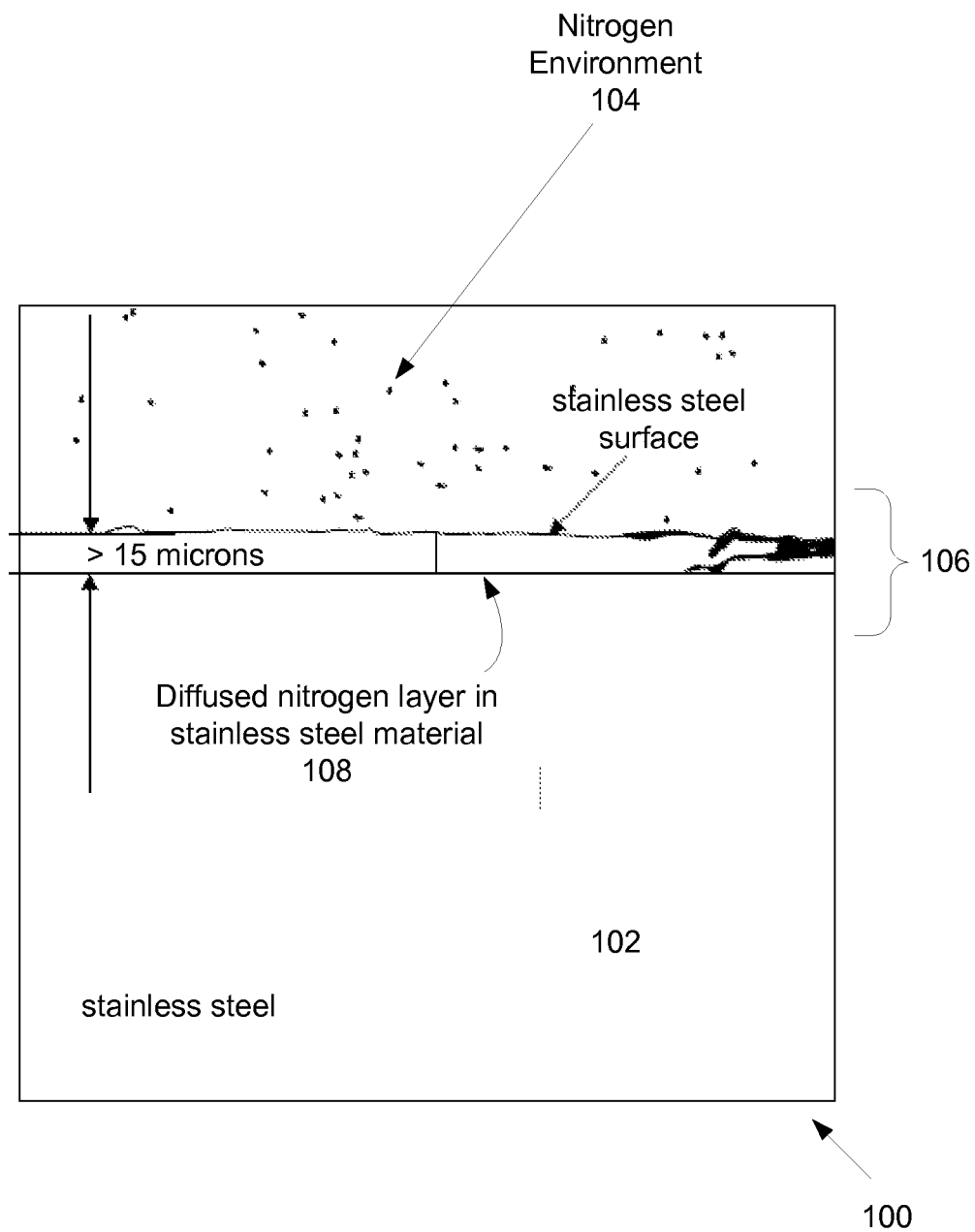
FIG. 1 shows a representative cross section of a sample of stainless steel.

FIG. 1 shows a representative cross section 100 of a sample 102 of stainless steel. In order to form a nitride layer (CrN), sample 102 can be placed in nitrogen environment 104. In a thermal diffusion nitriding process, nitrogen environment 104 provides a source of nitrogen (N) atoms that have sufficient energy to thermally diffuse (described by Fick's Law) into surface region 106 of sample 102. As the nitrogen atoms diffuse into surface region 106, sufficient energy is lost such that most of the nitrogen atoms combine with Chromium (Cr) atoms present in stainless steel to form a CrN complex (which is actually ceramic in nature) referred to as nitride layer 108. For example, using a gas nitriding process, nitrogen environment 104 can take the form of a nitrogen rich gas usually ammonia ($NH_3$). When ammonia comes into contact with the heated sample 102, the ammonia can disassociate into nitrogen and hydrogen atoms. The nitrogen atoms can then diffuse from the surface of sample 102 into surface region 106 of the stainless steel. It should be noted, however, that times for gas nitriding can be quite long, that is, from about 10 hours to 110 hours.

In contrast to thermal diffusion type nitriding, plasma (ion) nitriding uses plasma-discharge physics. In vacuum, high-voltage electrical energy is used to form a plasma through which nitrogen ions are accelerated to impinge on the subject. This ion bombardment heats the subject, cleans the surface, and provides active nitrogen. Plasma nitriding achieves repetitive metallurgical results and complete control of the nitride layers. Plasma nitriding allows faster nitriding times and the quickly attained surface saturation of the plasma process results in faster diffusion. However, in order to eliminate crystalline damage caused by the energetic ions, the subject must undergo an annealing process.

A manufacturer can rely on the nitride layer for many things not the least of which include aesthetic look and feel of the product, scratch and wear resistance, and in some cases extended corrosion resistance. Therefore, depending upon the particular requirements of the manufacturer and the anticipated use/environment which the product will be exposed can influence both the choice of nitriding process to be used (i.e., plasma vs. nitrogen gas). One characteristic that provides a key factor in such a determination is the hardness of the nitride layer. In general, hardness usually implies a resistance to deformation and for metals the property is a measure of their resistance to permanent or plastic deformation. Hardness can be construed to most likely mean the resistance to indentation as well as an easily measured and specified quantity indicative of the strength and heat treatment of the metal. There are three general types of hardness measurements depending on the manner in which the test is conducted. The three type of hardness measurements are: scratch hardness, indentation hardness, and rebound, or dynamic, hardness.

Using scratch hardness, various minerals and other materials are rated on their ability to scratch one another. Scratch hardness is measured according to the Mohs' scale that consists of 10 standard minerals arranged in the order of their ability to be scratched. The softest mineral in this scale is talc (scratch hardness 1), while diamond has a hardness of 10. However, the Mohs' scale is not well suited for metals since the intervals are not widely spaced in the high-hardness range. Most hard metals fall in the Mohs' hardness range of 4 to 8. In dynamic-hardness measurements an object referred to as an indenter is usually dropped onto the metal surface and the hardness is expressed as the energy of impact. The Shore seleroscope (which is the commonest example of a dynamic-hardness tester) measures the hardness in terms of the height of rebound of the indenter.

A more relevant measure of hardness can be determined using the Vickers hardness test. The Vickers hardness test provides a continuous scale of hardness, for a given load, from very soft metals with a DPH of 5 to extremely hard materials with a HV of 1,500 (the Vickers hardness test is described in ASTM Standard E92-72). In practice, the Vickers hardness test uses a square-base diamond pyramid as the indenter (the included angle between opposite faces of the pyramid is 116°). The angle is chosen because it approximates the most desirable ratio of indentation diameter to ball diameter in the Brinell hardness test and due to the shape of the indenter, the Vickers hardness test is frequently referred to as the diamond-pyramid hardness test. The diamond-pyramid hardness number (HV) is defined as the load divided by the surface area of the indentation. In practice, this area is calculated from microscopic measurements of the lengths of the diagonals of the impression. The basic principle, as with all common measures of hardness, is to observe the questioned material's ability to resist plastic deformation from a standard source. The Vickers test can be used for all metals and has one of the widest scales among hardness tests. The unit of hardness given by the test is known as the Vickers Pyramid Number (HV). The HV may be determined from Eq. (1):

$$HV = \frac{L^2}{2P\sin\left(\frac{\theta}{2}\right)} \quad \text{Eq. (1)}$$

where:
P—applied load, kg
L—average length of diagonal left by the indenter (mm)
θ—angle between opposite faces of diamond (i.e., 116°)

Figure 2:
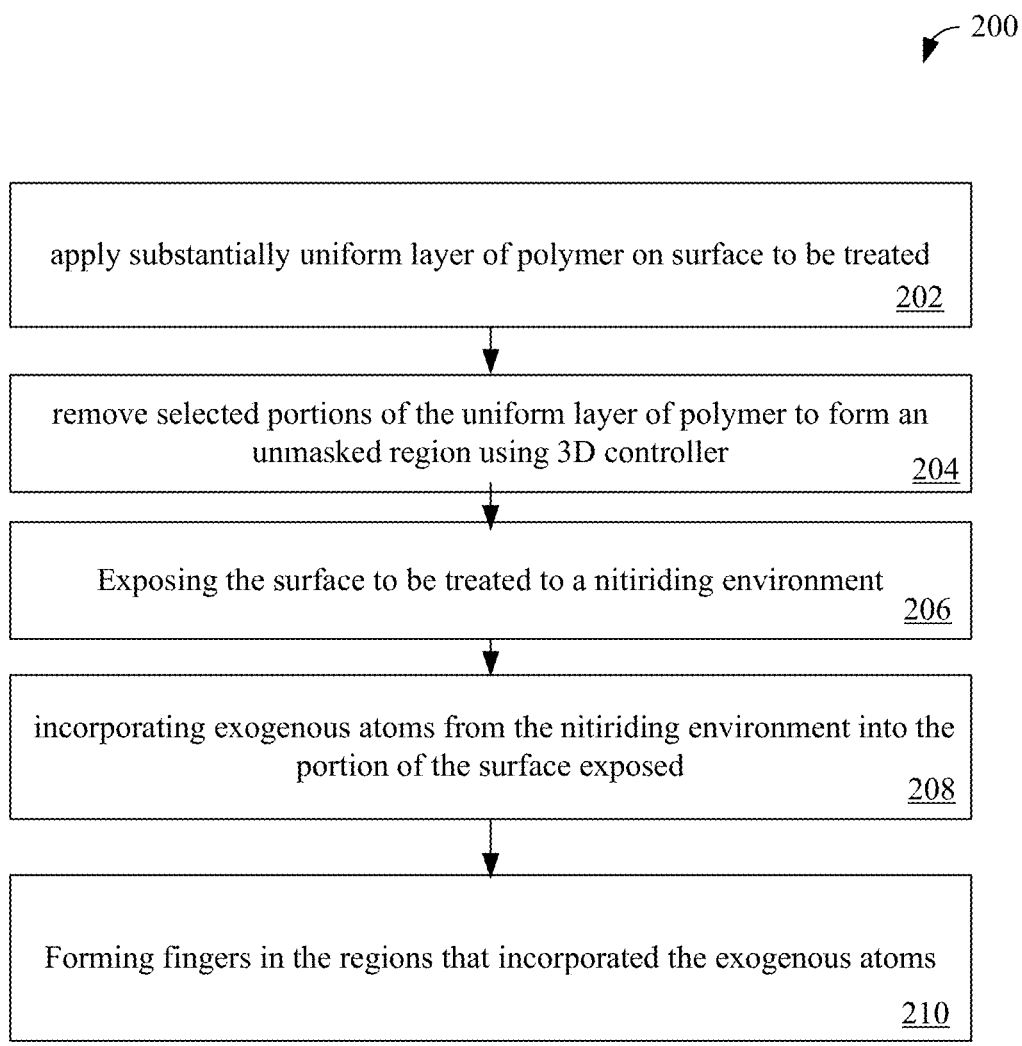
FIG. 2 shows a flowchart detailing a process in accordance with the described embodiments.

FIG. 2 shows flowchart detailing process 200 in accordance with the described embodiments. Process 200 can begin at 202 by applying a substantially uniform layer of polymer on a surface. At 204, selected portions of the uniform layer are removed to expose at least some of the surface in the form of an unmasked region. In one embodiment, the forming of the unmasked region can be carried out by a 3D controller or equivalent. At 206, the exposed surface portions are treated to a nitriding atmosphere (plasma, gaseous or other as appropriate). At 208 the exogenous atoms from the nitriding atmosphere are incorporated into the lattice of the exposed surface. At 210, nitride fingers are formed in the regions that incorporated the exogenous atoms.

FIG. 3 shows a representative cross section of surface S illustrating relative nano-particle average density for masked region and unmasked/exposed region. In order to mask a 3D surface, other techniques need be applied. For example, in one embodiment shown in FIG. 3, a masking agent can include a plurality of nano-particles. The nano-particles can be formed of, for example, silicates having a size of about 200 to about 100 nm. Initially, the nano-particles can form a substantially uniform mono-layer on the surface to be treated. The monolayer can be formed in many ways such as dipping the surface in a bath containing an emulsion of the nano-particles. In order to provide "filled" regions masked) and "non-filled" regions (unmasked) that are areas for growing the fingers during the nitride process.

The expansion area can be controlled by contemplating feature size and the desired average spacing of the nano-particles. The nano particles may repel each other thereby providing what is equivalent to a filled space. In the context of this discussing, the term "filled" can be defined as an area of the surface having a surface density of nano-particles sufficient to prevent any substantial growth in fingers during the nitriding process. Therefore, by filled it is not meant complete masking of a region as would be required with conventional photolithography, but more along the lines of a average density of nano-particles that effectively prevent substantial finger growth, or at least finger growth that would be noticed by a casual user of the consumer product having the treated surface.

Since average density of the nano particles is an important factor, the actual configuration of the nano-particles on the surface to be treated can, for example, have it honeycomb appearance as opposed to a continuous or nearly continuous layer of nano-particles. In another embodiment, the surface to be treated can be coated with a polymer that can then be removed using a 3D controller to form the masked regions and the unmasked regions. For example, in this embodiment it is contemplated that a 5 axis controller can be used.

Figure 6:
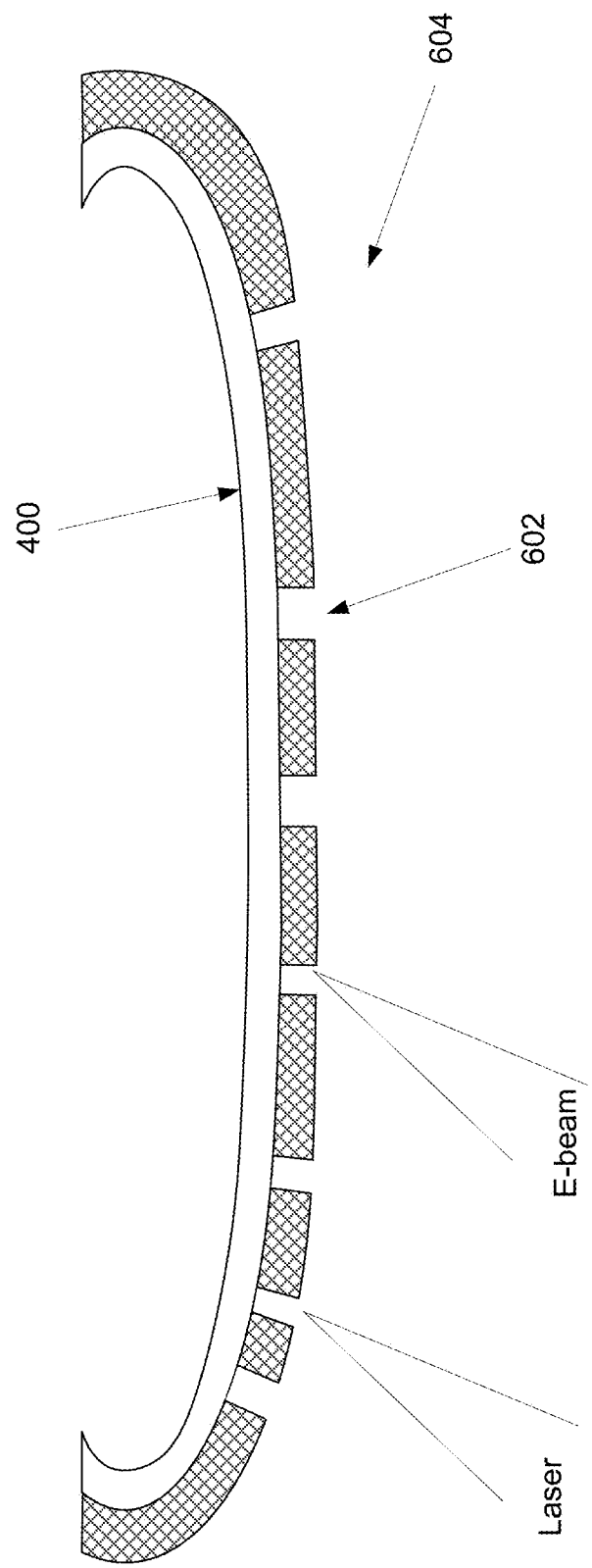
Figure 7:
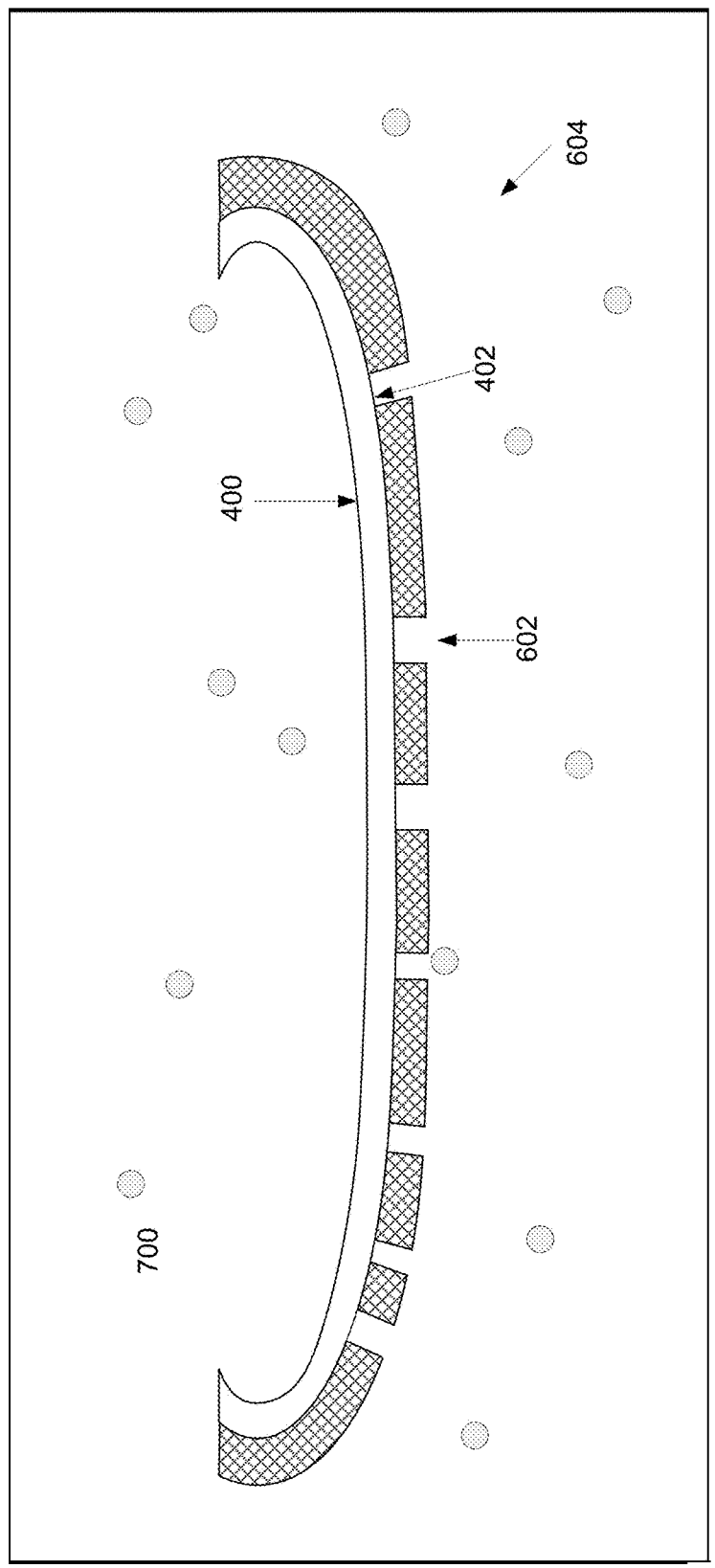
Figure 8:
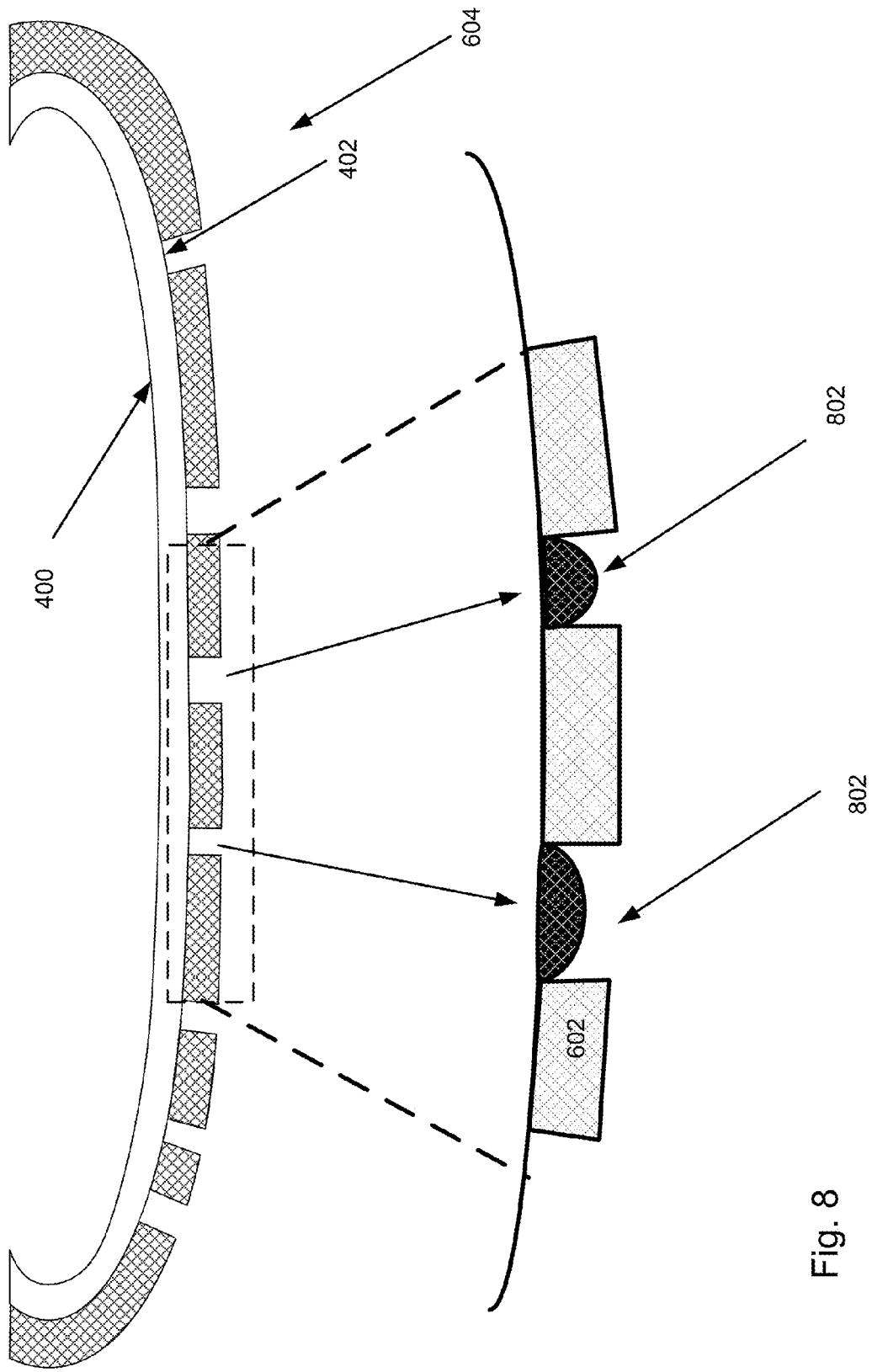
Figure 9:
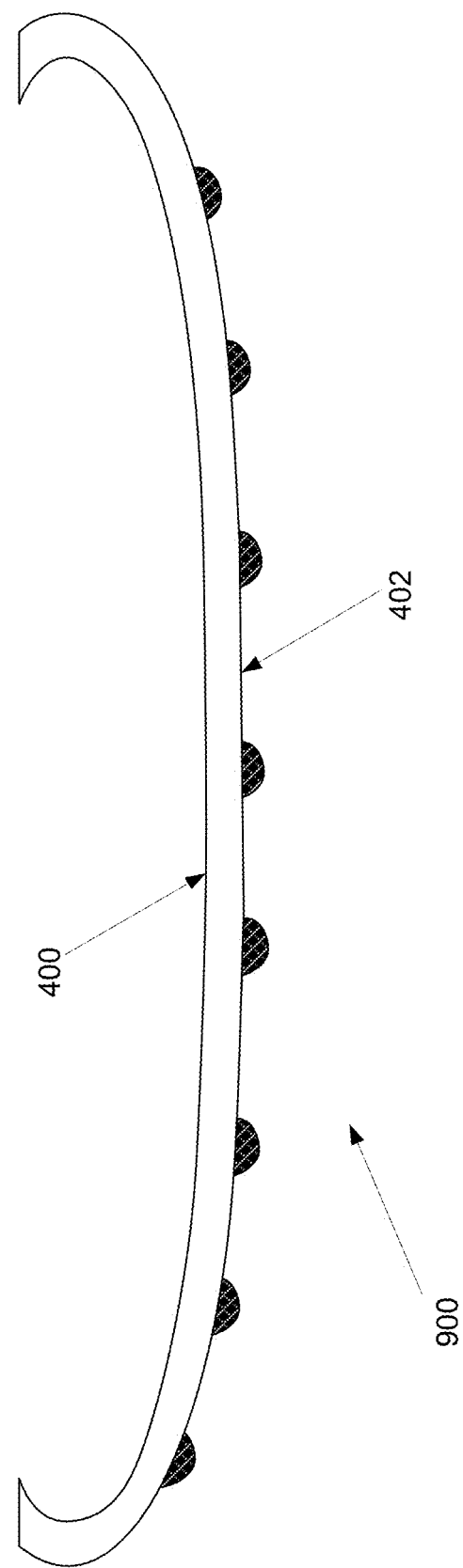

FIGS. 4-9 show representative cross sections detailing the formation of a three dimensional topology on a surface in accordance with one embodiment. FIG. 4 shows a cross sectional view of product 400 with surface 402 on which a 3D topology is desired. FIG. 5 shows product 400 having layer 404 of masking material applied to surface 402. FIG. 6 shows portions 602 of layer 404 removed to expose underlying portions of surface 402 to form masked pattern 604 of exposed portions and masked portions of surface 402. The removal of the portions of layer 404 can be carried out by, for example, laser ablating sections of layer 404 that are then vaporized. FIG. 7 shows product 400 having surface 402 overlaid with masked pattern 604 of masking material placed in a nitriding atmosphere 700. The nitriding atmosphere can be, for example, a plasma, gaseous atmosphere having a suitable concentration of at least nitrogen atoms or carbon atoms. FIG. 8 shows nitride formations in the form of a plurality of nitride fingers 802 at the exposed portions of surface 402. FIG. 9 shows product 400 having 3D topology 900 formed of the plurality of nitride fingers after removal of masked pattern 604.

Figure 10:
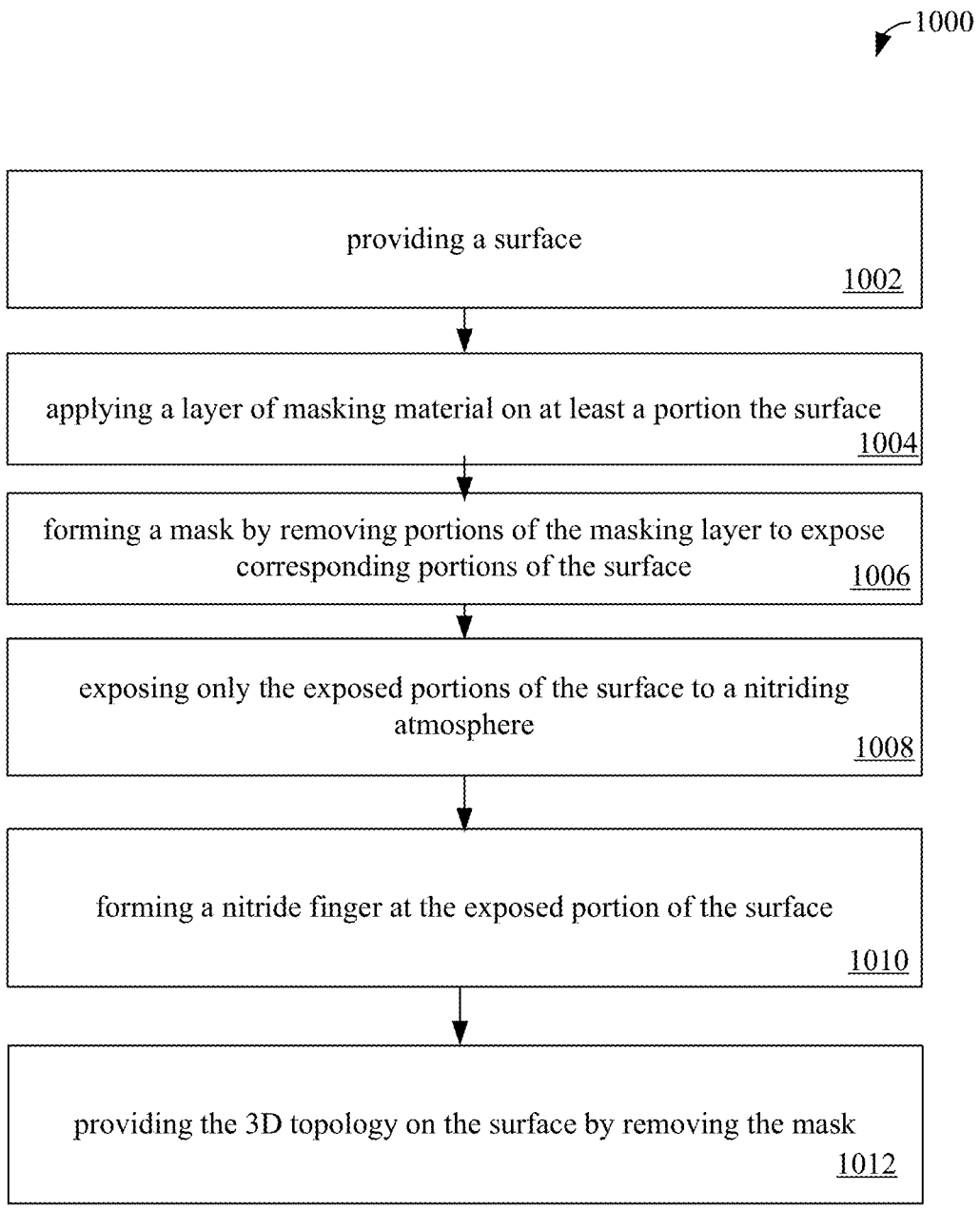
FIG. 10 is a flow chart detailing a process for forming the three dimensional topology as shown in FIGS. 1-8.

FIG. 10 is a flow chart detailing process 1000 for forming the three dimensional topology as shown in FIGS. 4-9. Process 1000 can begin at 1002 by providing a product having a surface on which a 3D topology is desired. Next at 1004, a layer of masking material is overlaid on the surface of the product. The layer can be formed of any suitable masking material such a polymer. At 1006, a masking pattern is formed in the layer by selectively removing portions of the masking layer exposing corresponding portions of the surface. At 1008, the product is exposed to a nitriding atmosphere and at 1010 nitride formations in the form of nitride fingers form at the exposed surface. At 1012, the masking material is removed to provide the product having the 3D topology formed of the nitride fingers on the surface.

Figure 13:
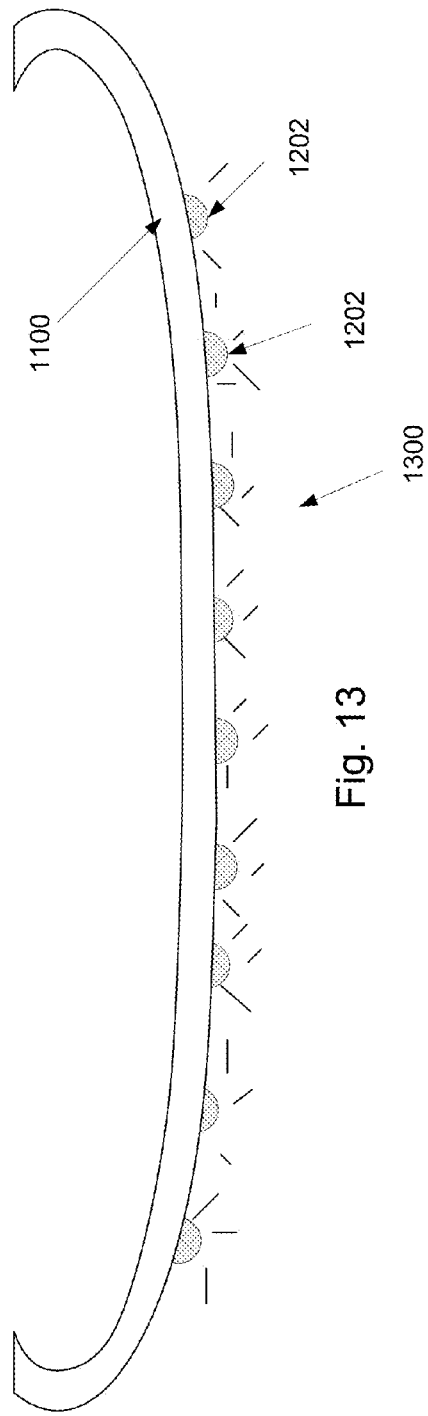
Figure 14:
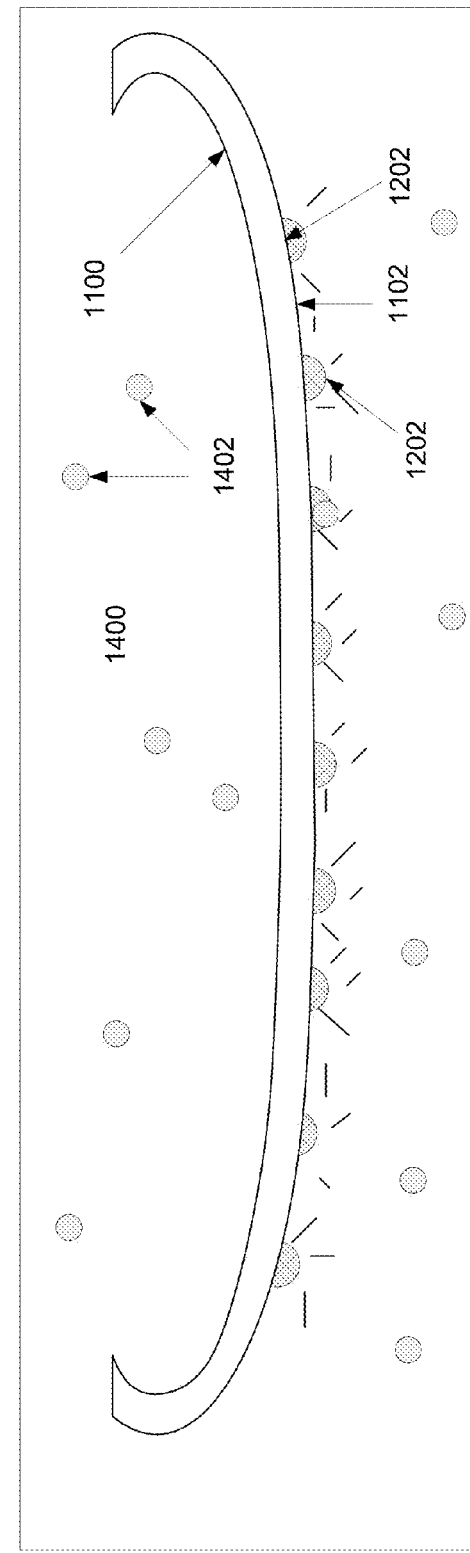

FIGS. 11-16 show representative cross sections detailing the formation of a three dimensional topology on a surface in accordance with one embodiment. FIG. 11 shows product 1100 having surface 1102 on which a 3D topology is desired. FIG. 12 shows the product immersed in solution 1200 of self organizing particles 1202. The self organizing particles can include, for example, nano-particles. FIG. 13 shows the self organizing particles forming a self organized pattern in the form of mask 1300 based upon, for example, mutual repulsion force between the particles. The self organized pattern can, for example, resemble a honeycomb in appearance depending upon the surface density of the particles. FIG. 14 shows product 1100 with surface 1102 overlaid with the self organized particles in the form of mask 1300 immersed in the nitriding atmosphere 1400 of exogenous atoms 1402 to form nitride formations 1500 in the form of nitride fingers shown in FIG. 15. FIG. 16 shows the self organized particles removed to provide product 1600 with the 3D topology 1602 formed of the nitride fingers.

Figure 17:
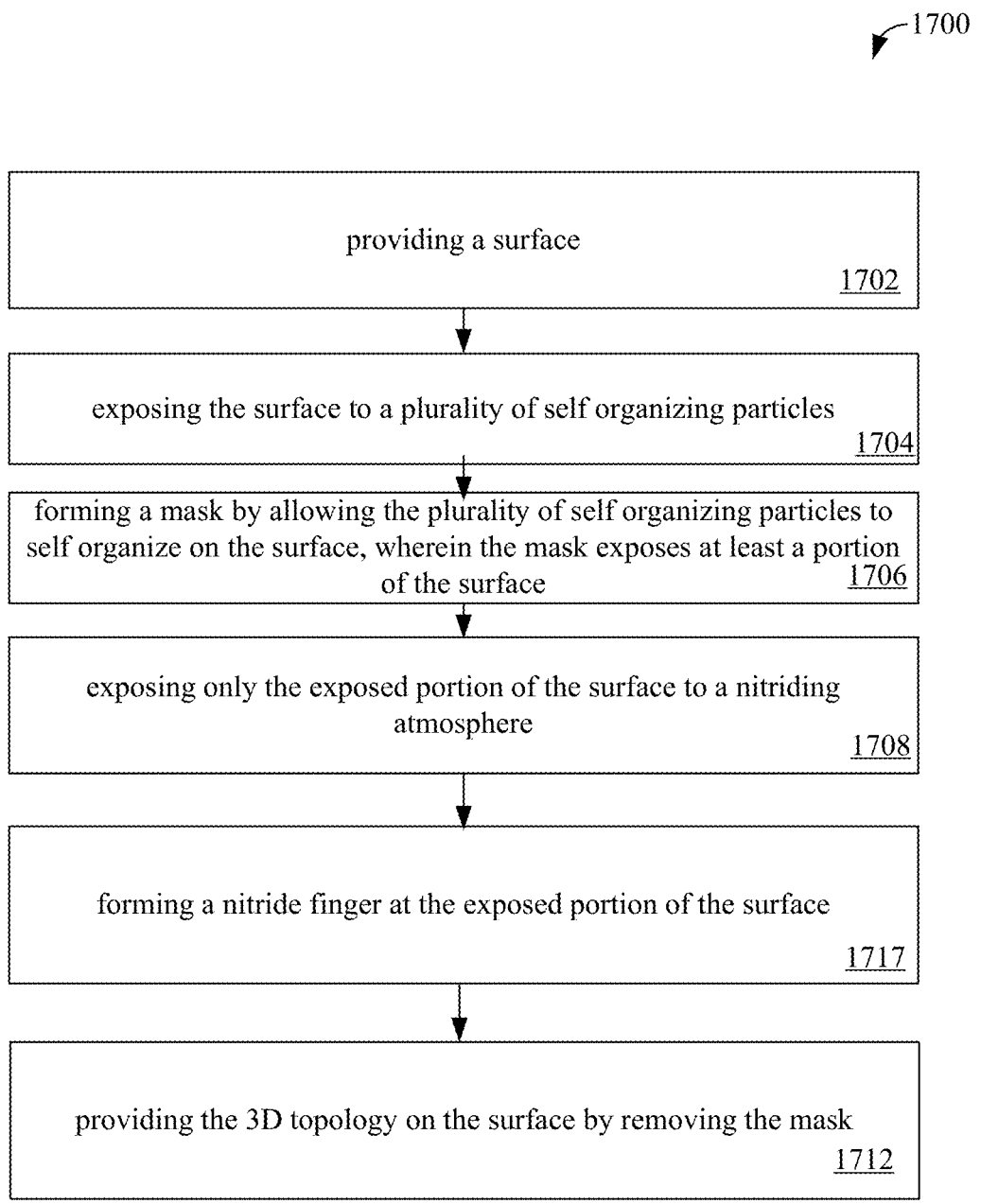
FIG. 17 is a flow chart detailing a process for forming the three dimensional topology as shown in FIGS. 11-16.

FIG. 17 is a flow chart detailing process 1700 for forming the three dimensional topology as shown in FIGS. 11-16. Process 1700 can begin at 1702 by providing a product having a surface on which a 3D topology is desired. At 1704, the product is immersed in an environment of self organizing particles. At 1706, the self organizing particles form a mask of particles based on, for example, mutual repulsion between the particles. At 1708, the product is exposed to a nitriding atmosphere causing nitride formations in the form of nitride fingers to form at 1710. At 1712, the self organized particles are removed to provide the product with the 3D topology.

What is claimed is:

1. A method, comprising:
   forming a monolayer of nano-particles on a stainless steel surface;
   masking the stainless steel surface forming a masked region and at least one unmasked region, the masked region having an average density of nano-particles sufficient to prevent substantial formation of a nitride finger at the surface of the stainless steel; and
   incorporating a plurality of exogenous atoms into the stainless steel surface only in the unmasked region, the incorporated exogenous atoms causing an associated metal lattice of the stainless steel surface to expand forming at least one nitride finger at the at least one unmasked region, thereby selectively forming a 3D topology on the stainless steel surface.

2. The method as recited in claim 1, wherein the incorporating the plurality of exogenous atoms comprises:
   exposing the stainless steel surface to a nitiriding environment; and
   receiving the exogenous atoms only at the stainless steel surface in the unmasked region.

3. The method as recited in claim 1, further comprising:
   growing a plurality of fingers in the portions of the stainless steel surface that receives the exogenous atoms, the fingers causing hardening, expanding, and increased corrosion resistance of the stainless steel surface.

4. The method as recited in claim 1, wherein the incorporating the plurality of exogenous atoms comprises:
   exposing the stainless steel surface to a nitriding environment.

5. The method as recited in claim 1, wherein the exogenous atoms are nitrogen atoms.

6. The method as recited in claim 1, wherein forming the monolayer of nano-particles comprises forming a patterned mask of self organizing particles.

7. The method as recited in claim 6, wherein a mutual repulsion force between the self organizing particles form the patterned mask.

8. The method as recited in claim 6, wherein the patterned mask resembles a honeycomb in appearance.

9. The method as recited in claim 1, wherein the nano-particles comprise silicates.

10. The method as recited in claim 1, wherein the nano-particles each have a size of between about 200-100 nanometers.

11. A method of forming a 3D topology on a stainless steel surface of a part, comprising:
   applying a layer of masking material on at least a portion the stainless steel surface;
   forming a mask by removing portions of the masking layer to expose corresponding portions of the stainless steel surface;
   exposing only the exposed portions of the stainless steel surface to a nitriding atmosphere;
   forming a nitride finger at the exposed portions of the stainless steel surface; and
   providing the 3D topology on the stainless steel surface by removing a remainder of the masking material from the stainless steel surface.

12. The method as recited in claim 11, wherein the portions of the masking layer are removed using a laser beam to ablate the masking material.

13. The method as recited in claim 11, wherein the portions of the masking layer are removed using an electron beam to ablate the masking material.

14. The method as recited in claim 11, wherein the nitriding atmosphere is a nitrogen plasma.

15. The method as recited in claim 11, wherein a plurality of nitride fingers are formed at a plurality of exposed portions of the stainless steel.

16. The method as recited in claim 11, wherein the nitriding atmosphere is a plasma comprising nitrogen atoms.

17. A method of forming a 3D topology on a stainless steel surface, comprising:
   providing the surface upon which a three dimensional topology is to be formed;
   exposing the surface to a plurality of self organizing particles;
   forming a mask by allowing the plurality of self organizing particles to self organize on the surface, wherein the mask exposes at least a portion of the surface;
   exposing only the exposed portion of the surface to a nitriding atmosphere;
   forming a nitride finger at the exposed portion of the surface; and
   providing the 3D topology on the surface by removing the mask.

18. The method as recited in claim 17, wherein the exposing the surface to the plurality of self organizing particles comprises:
   immersing the surface in a bath of self organizing particles.

19. The method as recited in claim 18, wherein the self organizing particles are electrostatically charged nano-particles.

20. The method as recited in claim 17, wherein the nitriding atmosphere is a nitrogen plasma.

21. The method as recited in claim 17, wherein a plurality of nitride fingers are formed at a plurality of exposed portions.

* * * * *